United States Patent
Overweg

(10) Patent No.: US 10,145,914 B2
(45) Date of Patent: Dec. 4, 2018

(54) MAGNETIC RESONANCE IMAGING GRADIENT COIL

(71) Applicant: KONINKLIJKE PHILIPS N.V., Eindhoven (NL)

(72) Inventor: Johannes Adrianus Overweg, Eindhoven (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 398 days.

(21) Appl. No.: 14/898,162

(22) PCT Filed: Jun. 16, 2014

(86) PCT No.: PCT/EP2014/062528
§ 371 (c)(1),
(2) Date: Dec. 14, 2015

(87) PCT Pub. No.: WO2014/202514
PCT Pub. Date: Dec. 24, 2014

(65) Prior Publication Data
US 2016/0139221 A1     May 19, 2016

(30) Foreign Application Priority Data
Jun. 17, 2013 (EP) .................................. 13172199

(51) Int. Cl.
*G01V 3/00* (2006.01)
*G01R 33/421* (2006.01)
*G01R 33/385* (2006.01)
*G01R 33/3815* (2006.01)
*G06F 17/50* (2006.01)

(52) U.S. Cl.
CPC ....... *G01R 33/4215* (2013.01); *G01R 33/385* (2013.01); *G01R 33/3815* (2013.01); *G06F 17/50* (2013.01)

(58) Field of Classification Search
CPC .................................................. G01R 33/4215
USPC ........................................ 324/319, 318, 322
See application file for complete search history.

(56) References Cited

U.S. PATENT DOCUMENTS

| | | |
|---|---|---|
| 4,733,189 A | 3/1988 | Punchard et al. |
| 5,083,085 A | 1/1992 | Morad |
| 5,296,810 A | 3/1994 | Morich |
| 5,406,204 A | 4/1995 | Morich et al. |

(Continued)

FOREIGN PATENT DOCUMENTS

| | | |
|---|---|---|
| JP | 2001212107 A | 8/2001 |
| JP | 2003164432 A | 6/2003 |

(Continued)

*Primary Examiner* — Louis Arana

(57) ABSTRACT

A magnetic gradient coil (110) for a magnetic resonance imaging system (100, 200) is actively shielded. The magnetic gradient coil is operable for generating a magnetic field (504). The magnetic field has a cylindrical axis of symmetry (130). The gradient coil has a length (132) parallel with the cylindrical axis of symmetry. The magnetic gradient coil has an outer surface (134). The magnetic field includes an external magnetic field outside of the outer surface. The external magnetic field has at least four reduced field regions (136, 138, 140, 142) along the length where the modulus of the magnetic field is less than the average of the modulus of the magnetic field along the length.

16 Claims, 11 Drawing Sheets

(56) References Cited

U.S. PATENT DOCUMENTS

| | | | | |
|---|---|---|---|---|
| 5,530,354 A | * | 6/1996 | Herlihy | G01R 33/3415 |
| | | | | 324/309 |
| 6,456,076 B1 | * | 9/2002 | Joseph | G01R 33/4215 |
| | | | | 324/309 |
| 6,822,452 B2 | | 11/2004 | Ham et al. | |
| 2007/0296414 A1 | | 12/2007 | Huang | |
| 2010/0271026 A1 | * | 10/2010 | Amm | G01R 33/385 |
| | | | | 324/318 |

FOREIGN PATENT DOCUMENTS

| | | |
|---|---|---|
| JP | 2008229360 A | 10/2008 |
| RU | 2483316 C1 | 5/2013 |

* cited by examiner

MAGNETIC RESONANCE IMAGING GRADIENT COIL

CROSS REFERENCE TO RELATED APPLICATIONS

This application is a U.S. national phase application of International Application No. PCT/EP2014/062528, filed on Jun. 16, 2014, which claims the benefit of EP Application Serial No. 13172199.5 filed on Jun. 17, 2013 and is incorporated herein by reference.

TECHNICAL FIELD

The invention relates to magnetic resonance imaging, in particular to the design and construction of magnetic gradient coils.

BACKGROUND OF THE INVENTION

A magnetic field is used in Magnetic Resonance Imaging to align the nuclear spins of atoms as part of the procedure for producing images within the body of a patient. This magnetic field is referred to as the B0 field. During an MRI scan, Radio Frequency (RF) pulses generated by a transmitter or amplifier and an antenna cause perturbations to the local magnetic field and can be used to manipulate the orientation of the nuclear spins relative to the B0 field. Spatial encoding of the magnetic spins may be accomplished by using so called gradient coils, which are used to superimpose a magnetic field gradient upon the B0 magnetic field. RF signals emitted by the nuclear spins are detected by a receiver coil, and these RF signals are used to construct the MRI images.

The magnets used to generate the B0 field typically use superconductive coils. The magnetic field generated by the gradient coils can cause eddy currents within the superconductive coils. These eddy currents can be avoided or reduced by using gradient coils with active shielding. U.S. Pat. No. 4,733,189 discloses an active shield about the gradient-forming components of a magnetic resonance imaging system. The actively shielded gradient magnetic field coil known from JP2008-229360 has a field distribution expanding radially and having three longitudinal regions in which a leakage gradient field expands.

SUMMARY OF THE INVENTION

The invention provides for a magnetic gradient coil, a magnet assembly, a magnetic resonance imaging system and a method and design of a magnetic gradient coil in the independent claims. Embodiments are given in the dependent claims.

As will be appreciated by one skilled in the art, aspects of the present invention may be embodied as an apparatus, method or computer program product. Accordingly, aspects of the present invention may take the form of an entirely hardware embodiment, an entirely software embodiment (including firmware, resident software, micro-code, and etc.) or an embodiment combining software and hardware aspects that may all generally be referred to herein as a "circuit," "module" or "system." Furthermore, aspects of the present invention may take the form of a computer program product embodied in one or more computer readable medium(s) having computer executable code embodied thereon.

Any combination of one or more computer readable medium(s) may be utilized. The computer readable medium may be a computer readable signal medium or a computer readable storage medium. A 'computer-readable storage medium' as used herein encompasses any tangible storage medium which may store instructions which are executable by a processor of a computing device. The computer-readable storage medium may be referred to as a computer-readable non-transitory storage medium. The computer-readable storage medium may also be referred to as a tangible computer readable medium. In some embodiments, a computer-readable storage medium may also be able to store data which is able to be accessed by the processor of the computing device. Examples of computer-readable storage media include, but are not limited to: a floppy disk, a magnetic hard disk drive, a solid state hard disk, flash memory, a USB thumb drive, Random Access Memory (RAM), Read Only Memory (ROM), an optical disk, a magneto-optical disk, and the register file of the processor. Examples of optical disks include Compact Disks (CD) and Digital Versatile Disks (DVD), for example CD-ROM, CD-RW, CD-R, DVD-ROM, DVD-RW, or DVD-R disks. The term computer readable-storage medium also refers to various types of recording media capable of being accessed by the computer device via a network or communication link. For example a data may be retrieved over a modem, over the internet, or over a local area network. Computer executable code embodied on a computer readable medium may be transmitted using any appropriate medium, including but not limited to wireless, wire line, optical fiber cable, RF, etc., or any suitable combination of the foregoing.

A computer readable signal medium may include a propagated data signal with computer executable code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

'Computer memory' or 'memory' is an example of a computer-readable storage medium. Computer memory is any memory which is directly accessible to a processor. 'Computer storage' or 'storage' is a further example of a computer-readable storage medium. Computer storage is any non-volatile computer-readable storage medium. In some embodiments computer storage may also be computer memory or vice versa.

A 'processor' as used herein encompasses an electronic component which is able to execute a program or machine executable instruction or computer executable code. References to the computing device comprising "a processor" should be interpreted as possibly containing more than one processor or processing core. The processor may for instance be a multi-core processor. A processor may also refer to a collection of processors within a single computer system or distributed amongst multiple computer systems. The term computing device should also be interpreted to possibly refer to a collection or network of computing devices each comprising a processor or processors. The computer executable code may be executed by multiple processors that may be within the same computing device or which may even be distributed across multiple computing devices.

Computer executable code may comprise machine executable instructions or a program which causes a processor to perform an aspect of the present invention. Computer executable code for carrying out operations for aspects of the present invention may be written in any combination of one or more programming languages, including an object oriented programming language such as Java, Smalltalk, C++ or the like and conventional procedural programming languages, such as the "C" programming language or similar programming languages and compiled into machine executable instructions. In some instances the computer executable code may be in the form of a high level language or in a pre-compiled form and be used in conjunction with an interpreter which generates the machine executable instructions on the fly.

The computer executable code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described with reference to flowchart illustrations and/or block diagrams of methods, apparatus (systems) and computer program products according to embodiments of the invention. It will be understood that each block or a portion of the blocks of the flowchart, illustrations, and/or block diagrams, can be implemented by computer program instructions in form of computer executable code when applicable. It is further under stood that, when not mutually exclusive, combinations of blocks in different flowcharts, illustrations, and/or block diagrams may be combined. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

A 'user interface' as used herein is an interface which allows a user or operator to interact with a computer or computer system. A 'user interface' may also be referred to as a 'human interface device.' A user interface may provide information or data to the operator and/or receive information or data from the operator. A user interface may enable input from an operator to be received by the computer and may provide output to the user from the computer. In other words, the user interface may allow an operator to control or manipulate a computer and the interface may allow the computer indicate the effects of the operator's control or manipulation. The display of data or information on a display or a graphical user interface is an example of providing information to an operator. The receiving of data through a keyboard, mouse, trackball, touchpad, pointing stick, graphics tablet, joystick, gamepad, webcam, headset, gear sticks, steering wheel, pedals, wired glove, dance pad, remote control, and accelerometer are all examples of user interface components which enable the receiving of information or data from an operator.

A 'hardware interface' as used herein encompasses an interface which enables the processor of a computer system to interact with and/or control an external computing device and/or apparatus. A hardware interface may allow a processor to send control signals or instructions to an external computing device and/or apparatus. A hardware interface may also enable a processor to exchange data with an external computing device and/or apparatus. Examples of a hardware interface include, but are not limited to: a universal serial bus, IEEE 1394 port, parallel port, IEEE 1284 port, serial port, RS-232 port, IEEE-488 port, Bluetooth connection, Wireless local area network connection, TCP/IP connection, Ethernet connection, control voltage interface, MIDI interface, analog input interface, and digital input interface.

A 'display' or 'display device' as used herein encompasses an output device or a user interface adapted for displaying images or data. A display may output visual, audio, and or tactile data. Examples of a display include, but are not limited to: a computer monitor, a television screen, a touch screen, tactile electronic display, Braille screen, Cathode ray tube (CRT), Storage tube, Bi-stable display, Electronic paper, Vector display, Flat panel display, Vacuum fluorescent display (VF), Light-emitting diode (LED) displays, Electroluminescent display (ELD), Plasma display panels (PDP), Liquid crystal display (LCD), Organic light-emitting diode displays (OLED), a projector, and Head-mounted display.

Magnetic Resonance (MR) data is defined herein as being the recorded measurements of radio frequency signals emitted by atomic spins by the antenna of a Magnetic resonance apparatus during a magnetic resonance imaging scan. Magnetic resonance data is an example of medical image data. A Magnetic Resonance Imaging (MRI) image is defined herein as being the reconstructed two or three dimensional visualization of anatomic data contained within the magnetic resonance imaging data. This visualization can be performed using a computer.

In one aspect the invention provides for a magnetic gradient coil for a magnetic resonance imaging system. The magnetic gradient coil is actively shielded. An actively shielded magnetic gradient coil comprises multiple layers with windings that are used to tailor the magnetic field generated by the gradient coil. It is generally desirable to create the magnetic gradient field in the region where imaging is being performed on a subject. The external magnetic field from the gradient coils may interfere with the superconducting magnet used for generating the main or so called B0 magnetic field used for magnetic resonance imaging. Such magnetic coupling can result in induced currents (which produce unwanted magnetic fields), heating and, in extreme cases, even gradual or sudden loss of field of the main field magnet.

The shielding windings of the actively shielded magnetic gradient coils are used to reduce or eliminate the magnetic field generated by the magnetic gradient coil outside of it.

The magnetic gradient coil is operable for generating a magnetic field. The main field magnet has a cylindrical axis of symmetry. The main (B0) field is directed along this axis of symmetry. The gradient coils are designed such as to generate defined gradients in the field component directed along the cylindrical axis of symmetry; for reasons of conservation of magnetic flux, the other field components will be present as well. It may be in some instances that the axis of symmetry is also a mechanical axis of symmetry with respect to the housing or case of the magnetic gradient coil; however this does not need to be the case. For instance the inner boundary of the gradient coil assembly need not be cylindrical. It may be elliptical, prismatic or may be asymmetrical in the up or down direction. The gradient coil has a length parallel with the cylindrical axis of symmetry. The length as used herein is simply a direction or path in space. The magnetic gradient coil has an outer surface. The magnetic field comprises an external magnetic field outside of the outer surface. The external field has at least four reduced field regions along the length where the modulus magnetic field is less than the average of the modulus of the magnetic field along the length. In other words if one goes outside of the magnetic gradient coil at an exterior surface of the gradient coil and measures the magnetic field along a directed path that is parallel with the cylindrical axis of symmetry there will be at least four regions along the length where the modulus magnetic field is less than the average of the modulus of the magnetic field along the length.

Conventional magnetic gradient coils are designed such that the magnetic field outside of the magnetic gradient coil is reduced in the entire volume directly surrounding the outer boundary of the gradient coil. Embodiments of the invention are engineered such that there are reduced field regions only in discreet locations. These may be lined up or aligned with coils in the main magnet. By looking at the magnetic field outside of the magnetic gradient coil it is straight forward to differentiate a magnetic gradient coil according to an embodiment N1 which is 0. Such a magnetic gradient coil as described herein may have several different advantages. First of all the magnetic field is essentially allowed to expand in between the locations of where coils in the main magnet could be located. This makes the magnetic gradient coil more efficient while still reducing unwanted magnetic coupling with the main magnet. This also enables the use of a power supply with reduced power requirements. The reduction in the power requirements also enables the use of a magnetic gradient coil power supply with reduced power requirements and/or power consumption.

A magnetic gradient coil as used herein encompasses one or coil for superimposing a so called gradient magnetic field on an imaging zone or region when performing magnetic resonance imaging. The magnetic gradient coil is used for spatially encoding nuclear spins so that spatially resolved images can be reconstructed. References to "a gradient coil" or "one gradient coil" should be interpreted as being one or more or a set of gradient coils. Multiple gradient coils are used in a magnetic resonance imaging system to perform spatial encoding in three-dimensions. For a cylindrical magnet, the axis of symmetry is referred to as the z-axis. A z-gradient coil performs encoding along the z-axis. Two other gradient coils are typically used to generate gradients along an x-axis and y-axis. These other two axes are typically chosen so that they are orthogonal to each other and to the z-axis. The gradient coils corresponding to the x-axis and the y-axis are typically referred to as the x-gradient coil and the y-gradient coil respectively. Embodiments include replacing one or more conventional gradient coils with a gradient coil as described herein. Each of the x-gradient coil, the y-gradient coil, and the z-gradient coils would have its own separate layers in the gradient coil or gradient coil assembly.

In one example, the x-gradient coil, the y-gradient coil, and the z-gradient coil are constructed according to an embodiment. In another example, the x-gradient coil and the y-gradient coil are constructed according to an embodiment and the z-gradient coil is a conventional actively shielded gradient coil.

In another embodiment the linear extent of each of the reduced field regions as measured along the length is at least 10% of the distance between two adjacent reduced field regions. This is beneficial because the reduced field region is actually a large volume and is not simply a single point where the field strength reduces.

In another embodiment the modulus of the external field within any one of the reduced field regions is at least a factor of 2.5 times smaller than the average of the modulus of the magnetic field along the length. This embodiment may be beneficial because the reduction in the field reduces the coupling between the magnetic gradient coil and the coils in the main magnet.

In another embodiment the modulus external magnetic field within any one of the reduced field regions is at least a factor of 5 times smaller than the average of the modulus magnetic field along the length.

In another embodiment the modulus of the external field within any one of the reduced field regions is at least a factor of 10 times smaller than the average of the modulus of the magnetic field along the length.

In another embodiment the modulus of the external field within any one of the reduced field regions is at least a factor of 20 times smaller than the average of the modulus of the magnetic field along the length.

In alternative embodiments the modulus of the external field within all of the reduced field regions is at least a factor of 20, 10, 5, or 2.5 times smaller than the average of the modulus of the magnetic field along the length.

In another embodiment the gradient coil has an inner conductive layer and an outer conductive layer. The inner conductive layer and outer conductive layer are formed by coils. The inner conductive layer comprises a first set of discreet current loops connected in series and the outer conductive layer comprises a second set of discreet current loops connected in series. The first set is connected in series to the second set.

In another embodiment the magnetic gradient coil comprises three distinct gradient coils performing three-dimensional spatial encoding. The reduced field zones of all three gradient coils coincide and correspond to the typical positions of primary coils of a superconducting magnet. These for instance may be the primary coils of a superconducting whole body magnet used for magnetic resonance imaging.

In another aspect the invention provides for a magnet assembly for a magnetic resonance imaging system comprising the actively shielded gradient coil according to an embodiment of the invention and a magnet. The magnet is a superconducting magnet with multiple superconducting coils. The magnet is a cryogen-free magnet (meaning that the sections of the magnet are not immersed in a large volume of liquid helium but cooled by thermal contact to an active refrigerator and the space between the sections of the main magnet does not contain large amounts of electrically conducting material such as a tank containing the helium of a bath cooled magnet).

Cryogen-free magnets may be considered to be magnets that do not use large amounts of liquid cryogen.

Cryogen-free magnets use a cryogenic insulation system to be able to cool down the magnet to a temperature of about 4 Kelvin if it uses conventional low temperature superconductors and maybe 30-50K in case high temperature superconductors are used. The cryogenic insulation comprises an outer vacuum container, completely enclosing the magnet, enabling an insulating vacuum around the cold mass with a very low pressure. The insulation also features at least one radiation shield inside the vacuum space, which has the function to intercept radiation heat coming from the warm surface of the vacuum container. By thermally connecting this radiation shield to the refrigerator, nearly all of this radiation heat is removed from the system. The shield then provides a cold surface facing the cold inner parts of the magnet, which radiates far less heat than the room temperature wall. Conventional (bath cooled) magnets typically contain 1000-2000 liters of liquid helium in the tank surrounding the magnet coils. Cryogen-free magnets can work with a helium inventory of several liters.

There is a superconducting coil selected from the multiple superconducting coils centered coaxially about each reduced field region. In other words the coils of the superconducting coils are aligned or positioned in the reduced field regions. This is beneficial because the magnetic field is able to expand between the superconducting coils of the magnet whereas even though there is reduced coupling between the magnetic gradient coil and the multiple coils of the superconducting magnet.

If the magnetic resonance imaging magnet for which the magnetic gradient coil is designed has mirror symmetry, the pattern of reduced field regions also has a mirror symmetry or anti-symmetry relative to the Z0 plane where Z is an axis of symmetry of the magnetic field of the magnet.

In another embodiment the magnet comprises a warm bore tube and a radiation screen. The radiation screen comprises an inner cylinder of the radiation screen between the warm bore tube and the multiple superconducting coils.

In another embodiment the warm bore tube and the inner cylinder of the radiation screen are electrically non-conducting or have a much higher electrical impedance in azimuthal direction than in the axial direction of the cylinder. This embodiment may be beneficial because this would enable the magnetic field to penetrate the warm bore tube and the inner cylinder of the radiation screen.

In another embodiment the inner cylinder is formed from a dielectric.

In another embodiment the inner cylinder of the radiation screen is formed from a conductive material with slots operable to block eddy currents generated by the external magnetic field of the magnetic gradient coil. This is beneficial because the radiation screen can be made of a highly thermal conductive material such as a metal, however it would still allow the magnetic field to pass through it. For example a series of slits cut parallel to the center of axis of the magnet or the gradient coil would enable this.

In another embodiment the inner cylinder of the radiation screen is formed from a dielectric.

In another embodiment the warm bore tube comprises the magnetic gradient coil. This embodiment may be beneficial because the gradient coil is used to form the warm bore tube. This eliminates a component.

In another embodiment the magnet is a cryogen-free magnet. A cryogen-free magnet is a magnet without liquid helium. The superconducting windings of the MRI magnet are not enclosed in an electrically conducting helium tank but surrounded by vacuum. The coils of the magnet are cooled by means of thermal conduction or with a circulating gas and/or liquid in cooling tubes. These cooling tubes may be connected to a refrigerator. In another case, the magnet may be cooled by means of a helium bath but the helium tank may have an electrically non-conducting inner cylinder separating the liquid helium from the insulating vacuum in one case.

In another embodiment the gradient coil is operable for producing the external magnet field such that it expands between each superconducting coil. This is beneficial because it reduces the amount of energy necessary for powering the magnetic gradient coil.

In another aspect the invention provides for a magnetic resonance imaging system comprising a magnet assembly according to an embodiment of the invention.

In another aspect the invention provides for a method of designing a magnetic gradient coil for a magnetic resonance imaging system using magnetic design software. Magnetic design software as used herein encompasses software which accepts as input constraints on the generated magnetic field and uses the information to calculate the position of windings in order to generate the design of a magnetic gradient coil. The use of such magnetic design software is typically used by the designers of magnetic resonance imaging systems. As such the method of designing a magnetic gradient coil is essentially differentiated from the known methods by defining the constraints differently than is normally performed.

The method comprises the step of defining cylindrical surfaces or meshes corresponding to an inner conductive layer and an outer conducting layer of the gradient coil. Optionally this step may include defining conductive flange regions connecting the inner conductive layer and the outer conductive layer. The method further comprises defining constraints and forcing a magnetic field gradient with a predetermined linearity within an imaging volume inside the gradient coil. The magnetic gradient coil has an outer surface. The method further comprises defining constraining limits for an outer magnetic field surrounding the outer surface such that there are at least four reduced field regions corresponding to the location of the superconducting coil of a superconducting magnet.

Alternatively or including this step may also include defining surfaces acting as passive conducting rings at the locations of the reduced field regions in defining constraints for the current induced in these rings or the dissipation caused by these reduced currents. The previous three steps define an optimization problem for finding the current distribution in inner and outer field generating surfaces satisfying all constraints and having minimum magnetic stored energy and/or dissipation of the magnetic stored energy. The method further comprises solving the optimization problem. This for instance would be performed automatically by the magnetic design software.

The method further comprises converting a continuous stream function obtained as a result of optimization into a pattern of discreet current loops. The stream function is a scalar quantity on a surface, with the property that the difference in stream function value between any two points is the amount of current passing between these two points. An iso-contour line plot of the stream function with a certain constant step-size yields the shapes of discrete windings each carrying a current equal to this step-size. The theory of stream functions is described in the doctoral thesis: G. N.

Peeren, Stream Function Approach For Determining Optimal Surface Currents, Ph.D. Thesis, Technische Universiteit Eindhoven, 2003.

These continuous stream functions can be approximated into a pattern of discreet current loops. This step also comprises connecting these discreet current loops in series to define a gradient coil design.

In another embodiment the method further comprises the step of manufacturing the gradient coil according to the gradient coil design. This in combination with the other method steps may be considered to be a method of producing a magnetic gradient coil.

The current loop patterns may for instance be produced as wire wound, printed circuit based, or copper sheet punched coil parts.

It is understood that one or more of the aforementioned embodiments of the invention may be combined as long as the combined embodiments are not mutually exclusive.

BRIEF DESCRIPTION OF THE DRAWINGS

In the following preferred embodiments of the invention will be described, by way of example only, and with reference to the drawings in which.

DETAILED DESCRIPTION OF THE EMBODIMENTS

Like numbered elements in these figures are either equivalent elements or perform the same function. Elements which have been discussed previously will not necessarily be discussed in later figures if the function is equivalent.

Figure 1:
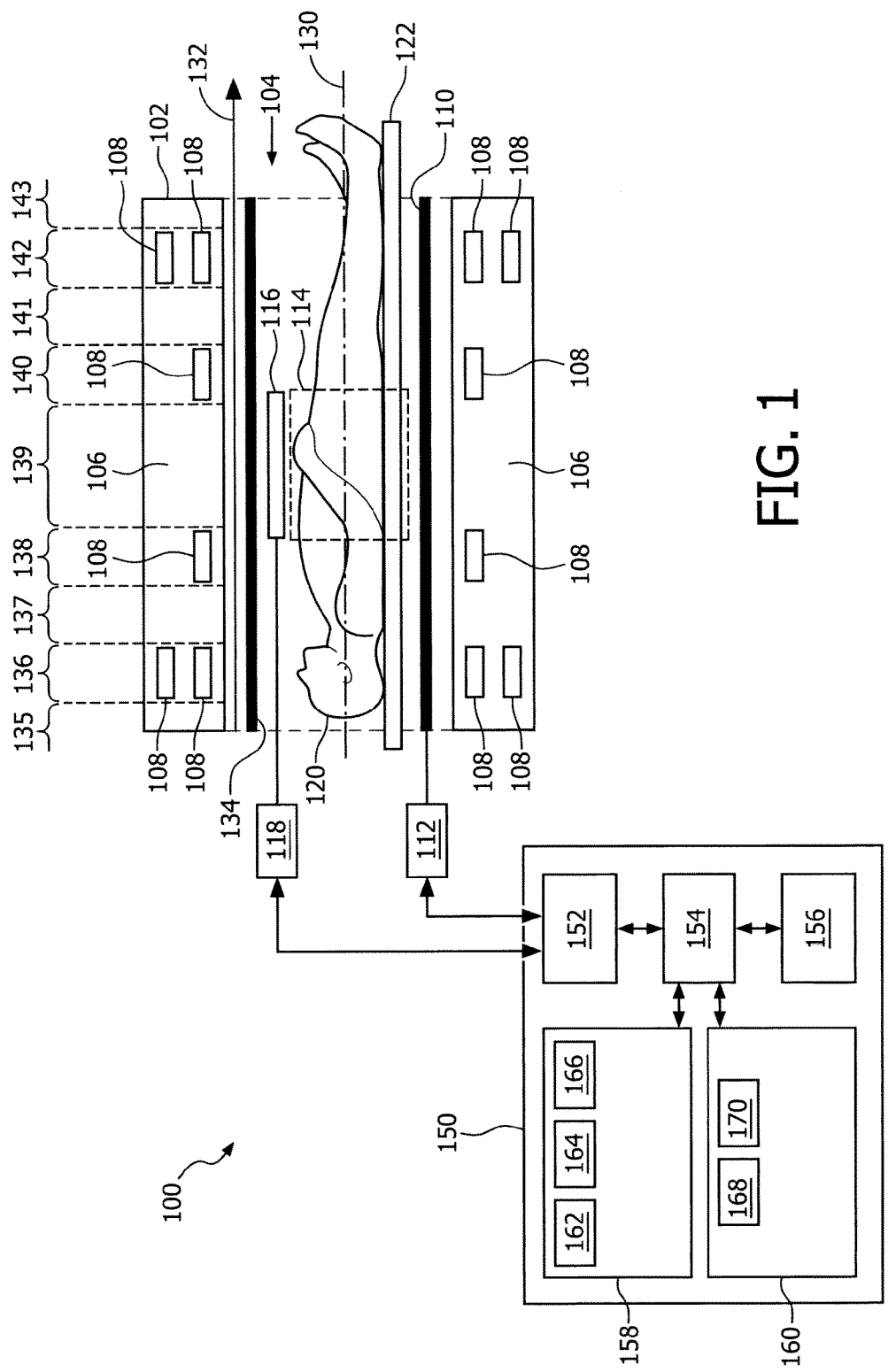
FIG. 1 shows an example of a cross-sectional and functional view of a magnetic resonance imaging system.

FIG. 1 shows a cross-sectional and functional view of a magnetic resonance imaging system 100. The magnetic resonance imaging system 100 is shown as comprising a magnet 102. The magnet 102 shown in FIG. 1 is a cylindrical type superconducting magnet. The magnet 102 has a bore 104 through the center of it. However, other magnets are also applicable for embodiments of the invention. The magnet 102 has a cryostat 106. Inside the cryostat 106 there is a collection of superconducting coils 108. The superconducting coils 108 are not enclosed in an electrically conducting helium tank. Either the helium tank has an electrically non-conducting inner cylinder, separating the liquid helium from the insulating vacuum or the coils of the magnet are cooled by means of thermal conduction or circulating gas. As an alternative or additional feature a small amount of gaseous or liquid helium in cooling tubes may be used to cool the superconducting coils, wherein the cooling tubes are connected to a refrigerator. Not all details of the magnet are shown in FIG. 1.

Within the bore of the magnet there is a magnetic field gradient coil 110 which is used for acquisition of magnetic resonance data to spatially encode objects within an imaging zone 114 of the magnet 102. The magnetic field gradient coil 110 is connected to a magnetic field gradient coil power supply 112. The magnetic field gradient coil 110 is intended to be representative. Typically magnetic field gradient coils contain three separate sets of coils for spatially encoding in three orthogonal spatial directions. The imaging zone 114 is located in the centre of the magnet 102.

Adjacent to the imaging zone 114 is a radio frequency coil 116 for manipulating the orientations of magnetic spins within the imaging zone 114 and for receiving radio transmissions from spins also within the imaging zone 114. The radio frequency coil 116 is connected to a radio frequency transceiver 118. The radio frequency coil 116 and radio frequency transceiver 118 may be replaced by separate transmit and receive coils and a separate transmitter and receiver. It is understood that the radio frequency coil 116 and the radio frequency transceiver 118 are representative of the different possibilities.

Within the center of the magnet is also located a subject 120. The subject 120 is shown as reposing on a subject support 122. The dashed line 130 represents a cylindrical axis of symmetry. It could be the axis of symmetry for the magnetic gradient coil 110 and/or the magnet 102. In this case the axis 130 is symmetric with respect to the housing of both the magnet 102 and the magnet gradient coil 110. The line 132 is a directed path or a length parallel to the axis 130 that runs along an outer surface of the magnetic gradient coil 134. There are dashed lines which divide the magnet 102 and the gradient coil 134 into a series of sections. These are labeled 135, 136, 137, 138, 139, 140, 141, 142 and 143. The regions 136, 138, 140 and 142 are so called reduced field regions. The magnetic field along the path 132 is less than the average along the entire path 132. The regions 135, 137, 139, 141 and 143 are higher field regions and the magnetic field from the gradient coil 110 is allowed to expand into these regions.

The radio frequency transceiver 118 and the magnetic field gradient coil power supply 112 are shown as being connected to a hardware interface 152 of a computer system 150. The computer system 150 uses a processor 154 to control the magnetic resonance imaging system 100.

The computer system 150 shown in FIG. 1 is representative. Multiple processors and computer systems may be used to represent the functionality illustrated by this single computer system 150. The computer system 150 comprises the hardware interface 152 which allows the processor 154 to send and receive messages to components of the magnetic resonance imaging system 100. The processor 154 is also connected to a user interface 156, computer storage 158, and computer memory 160.

The radio-frequency transceiver 118 and the magnetic gradient coil power supply 112 are connected to a hardware interface 152 of computer system 150. The computer storage 158 is shown as containing a pulse sequence.

The computer storage 158 is shown as containing a pulse sequence 162. The pulse sequence 162 is a series of commands or information which may be used to generate commands for controlling the operation of the magnetic resonance imaging system 100 to acquire magnetic resonance data. The computer storage is also shown as containing magnetic resonance data 164 that was acquired using the pulse sequence 162. The computer storage 158 is also shown as containing a magnetic resonance image 166 that was reconstructed from the magnetic resonance data 164.

The computer memory 160 is shown as containing a control module 168. The control module 168 contains computer-executable code which enables the processor 154 to control the operation and function of the magnetic resonance imaging system 100. This includes using the pulse sequence 162 to acquire the magnetic resonance data 164. The computer memory 160 is further shown as containing an image reconstruction module 170. The image reconstruction module contains computer-executable code which enables the processor 154 to perform mathematical functions on the magnetic resonance data 164 to reconstruct the magnetic resonance image 166.

Figure 2:
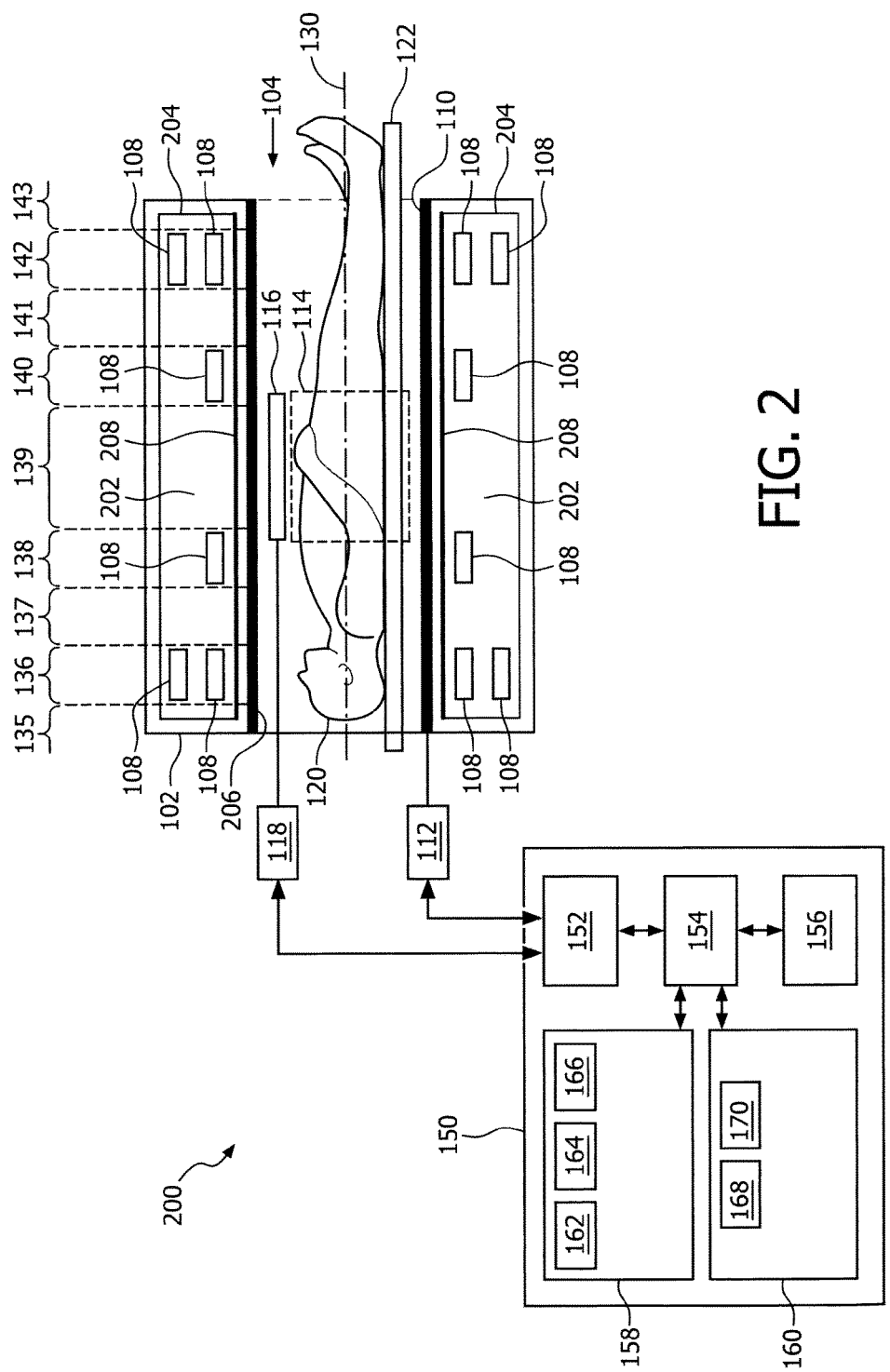
FIG. 2 shows a further example of a cross-sectional and functional view of a magnetic resonance imaging system.

FIG. 2 shows a magnetic resonance imaging system 200 similar to that shown in FIG. 1, however in this example more details of the magnet 102 are shown. Also in this FIG. the gradient coil is used as a warm bore 206.

The system of superconducting coils is enclosed by an outer vacuum container at room temperature. Inside the outer vacuum container is a vacuum region 202. The superconducting coils 108 are positioned inside the vacuum 202 and are individually cooled by either a liquid or gas cooling system connected to a cooling or refrigeration system. This magnet 102 has a warm bore 206 that is formed by the magnetic gradient coil 110. There is a radiation shield 204 between the connecting coils 108, the warm bore 206 and the walls of the magnet 102. There is an inner cylinder 208 of the radiation shield between the warm bore 206 and the superconducting coils 108. Both the warm bore 206 and the inner radius of the radiation shield 208 are operable to allow the magnetic field from the gradient coil 110 to pass through it. This may be accomplished by either using dielectric materials or particularly in the case of the inner cylinder of the radiation shield 208 to use a conductive material but cut slots in it to allow the magnetic field to expand into the higher field regions 135, 136, 139, 141 and 143.

Figure 3:
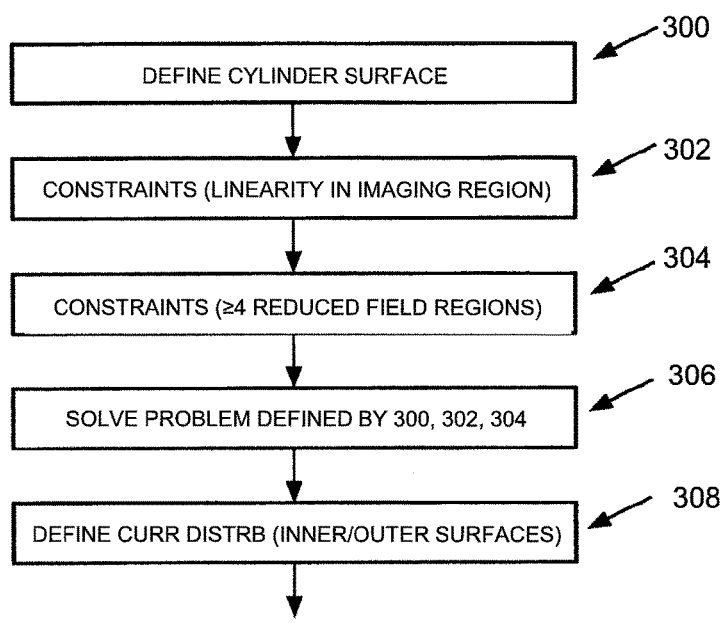
FIG. 3 shows a flow diagram which illustrates a method of designing a magnetic gradient coil.

FIG. 3 shows a flow diagram which illustrates a method of designing a magnetic gradient coil. Step 300 is defining a cylindrical surface or meshes corresponding to an inner conductive layer and an outer conductive layer of the gradient coil and optionally defining conducting flange regions connecting the inner conductive layer and the outer conductive layer. Next in step 302 constraints are defined forcing the magnetic gradient field with a predetermined linearity within an imaging volume inside the gradient coil. The imaging volume may be the imaging zone. The magnetic gradient coil has an outer surface. Next in step 304 constraints limiting a magnetic field surrounding the outer surface are defined such that there are at least four reduced field regions corresponding to the location of a superconducting coil of the superconducting magnet. This is performed optionally or with defining surfaces acting as passive conducting rings at the locations of the reduced field regions and defining constraints for the current induced in these rings or the dissipation caused by these induced currents.

The steps 300, 302 and 304 define an optimization problem for finding the current distribution in inner and outer field-generating surfaces satisfying all constraints and having the minimum magnetic stored energy and/or dissipation. These inner and outer field-generating surfaces will then be generated into current loop designs. Next in step 306 the optimization problem is solved using magnetic design software. And finally in step 308 the continuous stream functions obtained which define the current distributions in the inner and outer field-generating surfaces which were determined as a result of the optimization pattern are converted into a pattern of discreet current loops, and connecting these discreet current loops in series to define a gradient coil design. The current distributions in the inner and outer field-generating surfaces are defined by the continuous stream function.

Actively shielding the gradient coil only at the locations of superconducting magnet sections, letting the external field unconstrained in the regions between these sections, may improve the efficiency of the gradient system, compared to a fully actively shielded configuration, by a factor 2. This enables building a wide bore system using a magnet similar to the cryo-free magnet now being developed for a narrow-bore low-cost scanner. Actively shielded gradient coils are inherently inefficient because most of the field energy is located in the region between the primary and shield windings.

Allowing the field to expand into the external space makes the coil more efficient but would result in unwanted magnetic coupling with the main magnet. Such unwanted coupling may be avoided by using the coil design disclosed here.

The external field of the gradient coil is shielded only there where superconducting coil sections of the main magnet are located and is free to expand into the magnet environment in the spaces between magnet windings.

The radiation screen can be made transparent to AC magnetic fields, by providing a large number of axial interruptions in the conducting cylinder. The magnet bore can be made of non-conducting material; optionally the gradient coil can serve as the cryostat bore tube. The improvement in efficiency can be used to increase the patient bore. A gradient coil compatible with a patient space of 700 mm diameter and with a stored energy of less than 5 joule at 10 mT/m can be fitted inside a magnet with a coil ID of 886 mm. A magnet of this size would be just large enough for a narrow bore scanner when a conventional gradient coil is used. The external field shaping concept can but need not be combined with non-cylindrical shapes of the inner gradient windings. The concept can also be used to reduce the diameter and cost of the magnet for a narrow bore scanner. When applied to z-gradients, the external field must be shaped such that no net flux is coupled into the main magnet sections.

If the superconducting magnet is not enclosed in a conventional tank filled with liquid helium and if there is no other electrically conducting cylinder between the magnet sections, then the external field of the gradient coil need only be constrained at the location of the magnet windings. With suitable gradient design tools, it is possible to exploit this and generate gradient designs where the field of the gradient "bubbles out" between these magnet sections. The result of the simulations described here is that the efficiency of the gradient coil can be improved by a factor of 1.5-2. This gain can be used to decrease the distance between primary and shield coils of the gradient coil, which either reduces size and cost of the magnet on the outside of the gradient coil or increase the patient bore at constant magnet diameter.

The sections of the superconducting magnet may be re-optimized to maximize the space for the external gradient field to pass through, but this is a matter of straightforward magnet design.

The gradient coil to be used in this concept has a different shape but can be built using the same technology as conventional actively shielded gradient coils now used in the product.

1. Introduction

The gradient system in a whole-body MR system is one of the main cost drivers in the system. It is squeezed between the patient space with the RF system and the main field magnet and optimizing any of these (larger bore, smaller, cheaper magnet) drives the cost and complexity of the gradient system up. One of the reasons why conventional actively shielded gradient coils takes up so much space is the fact that current designs seek to reduce the external magnetic field of the gradient coil from interacting with the superconducting magnet and its cryostat. Any field escaping from the outer surface of the gradient tube will induce eddy-currents in the electrically conducting cylinders of the cryostat and field modulation in the superconducting magnet windings will cause increased dissipation in the cold mass. If it would be possible to leave away the active shielding layer; the primary gradient windings could be located near the inner bore of the cryostat. Such an unshielded gradient coil would, however, create far too much field in the cryogenic environment of a conventional helium bath-cooled MRI magnet.

1.1. Objective

Simulations have been performed to find out whether it makes sense to relax the external field requirements of a gradient coil, still keeping it decoupled from the windings of the superconducting main field magnet, but allowing field in the spaces between these winding sections. For the solutions found, the key properties of the gradient coil (stored energy, dissipation) were calculated and compared to the same parameters of an equivalent gradient coil designed using conventional methods and requirements.

2. Simulation Model and Method

The gradient coil was modeled in the usual way as two concentric cylindrical meshes. In all simulations, the field quality inside the coil was defined by a set of constraint points on an ellipsoidal volume extending 450 mm in radial direction and 360 mm in z-direction, with a maximum deviation from a linear gradient field of 0.3 mT at a gradient strength of 10 mT/m. The reference case of complete stray-field compensation was modeled in the conventional way, by limiting the induced current in a secondary surface at a radius of 10 mm outside the outer gradient layer. For the relaxed stray field model, the sections of the superconducting magnet were modeled as toroidal secondary surfaces covering the outer boundary of the superconductor bundles. (Wall thickness 1 mm, resistivity $10^{-9}$ Ohm·m). The magnet was a modified version of a small-bore 1.5T magnet design (warm bore ~820 mm), with smaller length/thickness ratio of the coil sections. This change increases the peak field on conductor but does not have a large impact on the amount of conductor. For each value of the outer radius of the gradient coil a new magnet was generated. An example of the model geometry is shown in FIG. 4.

Figure 4:
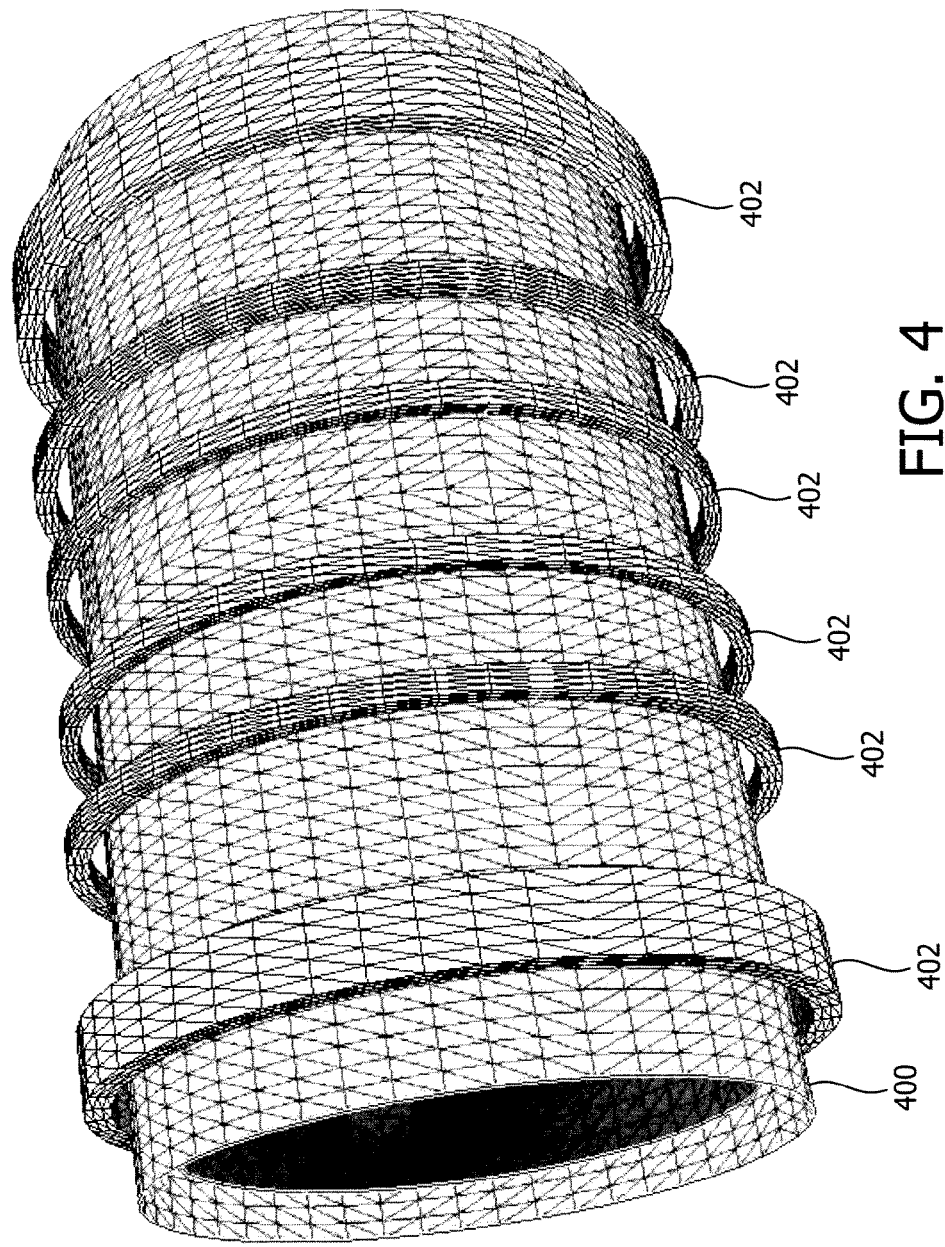
FIG. 4 shows a mesh which defines the magnetic gradient coil in two layers and the smaller cylinders labeled represent meshes defined for the coils of the superconducting magnet.

FIG. 4 shows a mesh 400 which defines the magnetic gradient coil in two layers and the smaller cylinders labeled 402 represent meshes defined for the coils of the superconducting magnet.

The objective to keep the external field of the gradient coil out of the volumes occupied by the superconducting wire could have been modeled as constraints limiting the normal component of the field on all boundary surfaces of the toroidal wire volumes. The simpler way to achieve the objective is to limit the dissipation in the surfaces bounding the coils. This was done by putting a heavy weight factor on the contribution of this dissipation to the cost function and by biasing the overall optimization towards minimizing the dissipation.

Figure 5:
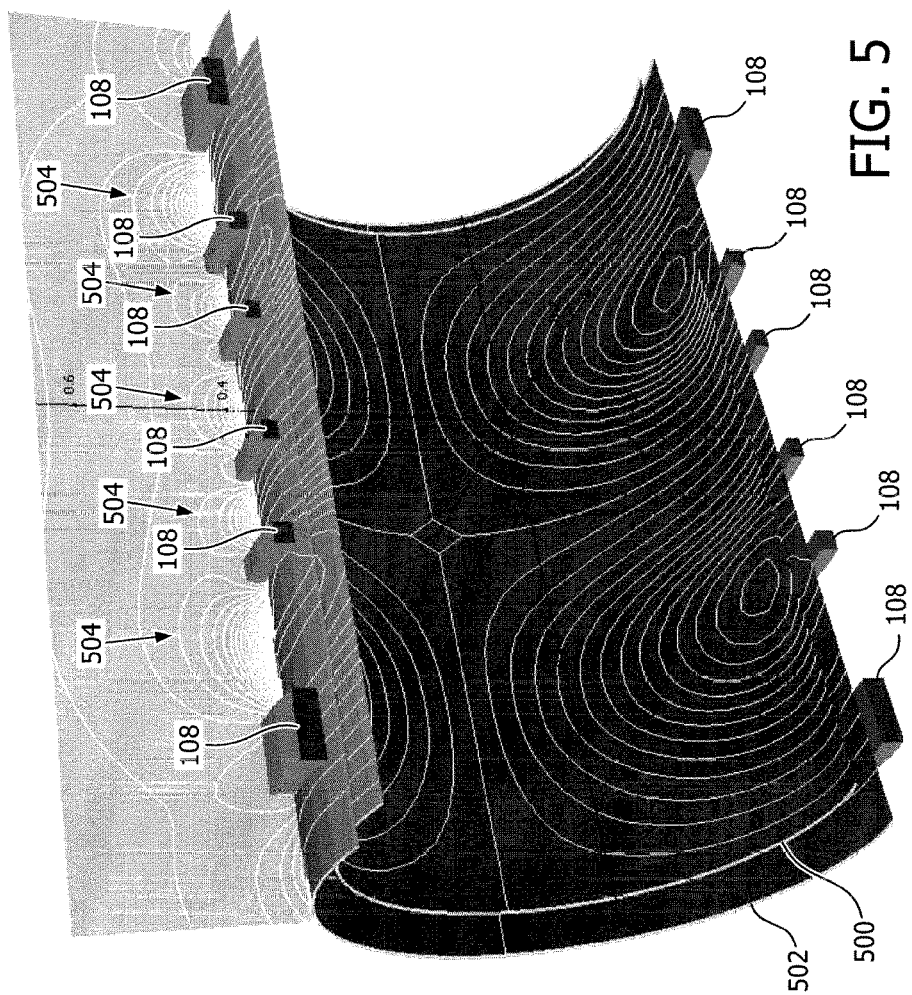
FIG. 5 shows an example of a typical example solution of the relaxed external fields.

FIG. 5 shows an example of a typical example solution of the relaxed external fields. 500 shows the design of an inner conductive layer. The circular lines indicate current loops and 502 represents the outer conductive layer of the magnetic gradient coil. The cylinders labeled 108 are again portions of the superconducting magnet and the solution as calculated by the magnetic design software is shown above the inner conductive layer 500, the outer conductive layer 502 and the superconducting coils 108. It can be seen that there is an expansion of the magnetic field 504 between adjacent conductors of the superconducting magnet.

A typical example of a solution with the relaxed external field constraints in shown in FIG. 5. The current pattern in the shield coil still resembles that of a classical active shield coil, but the shape of the windings has become more irregular. The field plot shown in FIG. 5 clearly demonstrates that the field is bulges out into the spaces between the coil sections. As will be shown in more detail in the next section, relaxing the external field strongly reduces both the stored energy and the dissipation in the gradient coil. Typically, both numbers are at least a factor 1.5 lower for the relaxed shielding case.

With the constraints used in the simulation, the typical dissipation in the magnet sections is approximately 0.5 W or less (for 10 mT/m RMS, 100% duty cycle). The boundaries of the coil were modeled as 1 mm thick copper sheet at helium temperature, resistivity $10^{-9}$ Ohm-m. If the sections of the real magnet are enclosed in such copper liners (in such a way that no closed conducting loops are formed) the dissipation can be kept within the cooling range of the refrigerator.

3. Results of Parametric Studies

In principle, the gain in efficiency resulting from relaxing the external field constraints can be used in two ways. Either the external dimensions of the system can be reduced at constant size of the patient bore or the patient bore can be increased at constant size of the magnet. Both pathways were explored in this study.

3.1. Compressing the Magnet at 600 mm Patient Bore

Figure 6:
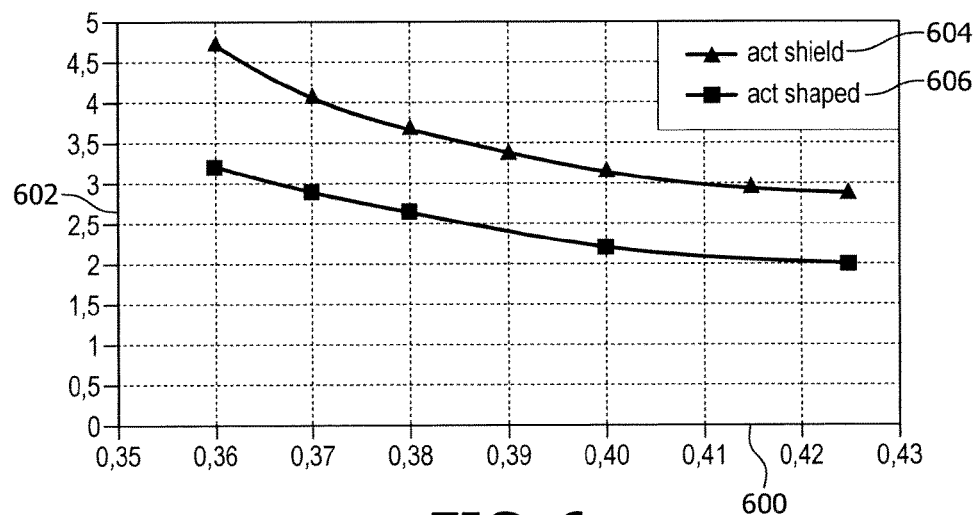
FIG. 6 shows a graph of the stored energy versus the coil outer radius.
Figure 7:
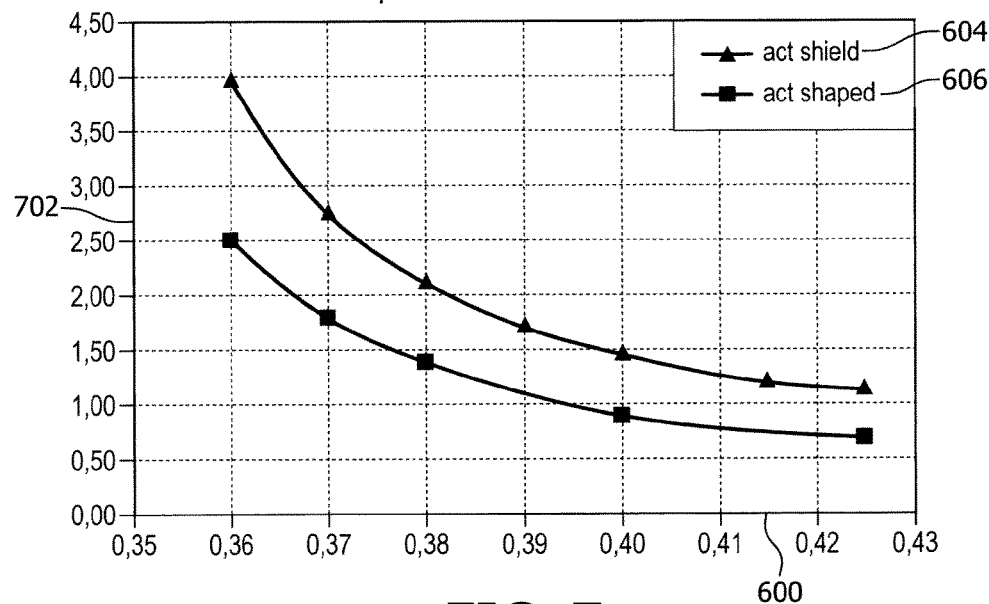
FIG. 7 shows the same plot for the conditions of FIG. 6 except the dissipation of energy is shown instead of the stored energy.

For a gradient coil with an inner radius of 325 mm the outer radius of the coil was varied between 360 and 425 mm. The results are shown in FIG. 6 and FIG. 7. Act shield designates a conventional fully shielded gradient coil, act shaped is short for a coil where the field is shaped such as to stay clear of the magnet windings.

FIG. 6 shows a graph of the stored energy 600 versus the coil outer radius 602. The coil outer radius is given in terms of meters and the stored energy is in arbitrary units. This is shown for fully shielded gradient coil 604 that is conventionally shielded versus an example of a field shaped gradient coil. The field shaped gradient coil shapes is operable to generate a magnetic field that avoids the superconductive coils. It can be seen that the stored energy is significantly lower for the field shaping.

FIG. 7 shows the same plot for the conditions of FIG. 6 except the dissipation of energy 702 is shown instead of the stored energy. Again it can be seen that the field-shaped gradient coil 606 has significantly less energy dissipation than the fully shielded coil 604. FIGS. 6 and 7 illustrate that examples of the magnetic gradient coil as described herein can greatly reduce the amount of stored energy and dissipation when compared to conventional magnetic gradient coils.

FIGS. 6 and 7 clearly show that active field shaping instead of fully shielding results in a significantly more efficient coil than a fully actively shielded coil. The difference in stored energy is approximately a factor 1.5 over the entire range of coil dimensions; the advantage of imperfect shielding increases somewhat on reducing the outer radius of the coil. FIG. 3 shows that it is possible to reduce the diameter of the magnet by about 100 mm until the stored energy of the relaxed gradient design reaches the level of the fully shielded coil.

The dissipation is also reduced by a factor 1.5 by relaxing the external shielding requirements on the coil design; the ratio increases as the outer radius of the coil is reduced. The dissipation values are those calculated by the modeler for current patterns for a copper thickness of 2 mm.

3.2. Magnet for Partly Shielded Gradients

Figure 8:
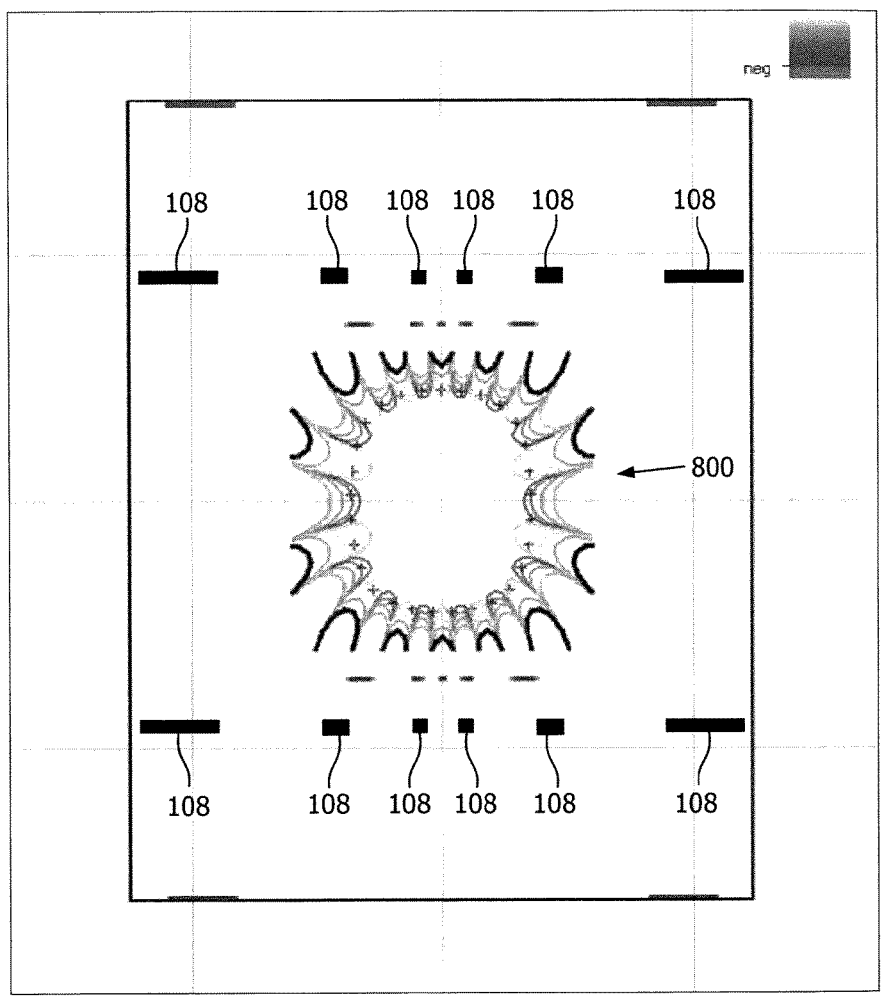
FIG. 8 shows the magnetic field contours in a model of a magnet defined by the superconducting coils.

In all subsequent simulations, the coil inner radius was set to 443 mm and the coil configuration was kept unchanged. The magnet used in these simulations is shown in FIG. 8. It is a classical 6+2 configuration with a good homogeneity within a deformed ellipsoid extending 430 mm in transverse direction and 360 mm in axial direction.

FIG. 8 shows the magnetic field contours 800 in a model of a magnet defined by the superconducting coils 108. FIG. 8 shows the main field magnet with 443 mm inner coil radius, contours are 3, 10, 30, and 100 uT. The gradient simulations showed, that it the exact location of the superconducting sections does not have a significant effect on the feasibility of gradient designs making use of the empty space between these coils. More important for the success of the approach is the shape of the magnet windings: the best gradient designs are obtained when the magnet windings have nearly square cross section (except for the end coils, these can be of high aspect ratio).

3.3. Wider Bore Gradient Coils Inside a Small-Bore Magnet

A series of gradient coils was simulated with increasing inner radius and a constant outer radius of 415 mm. The smallest of these coils corresponds to a 600 mm patient bore, the largest would nearly be large enough for a wide bore system. For comparison, the equivalent fully actively shielded gradients were also simulated (with an outer radius of 415 mm). Similar to what was seen before, the potential advantage of active field shaping increases when the gradient coil is compressed.

Figure 9:
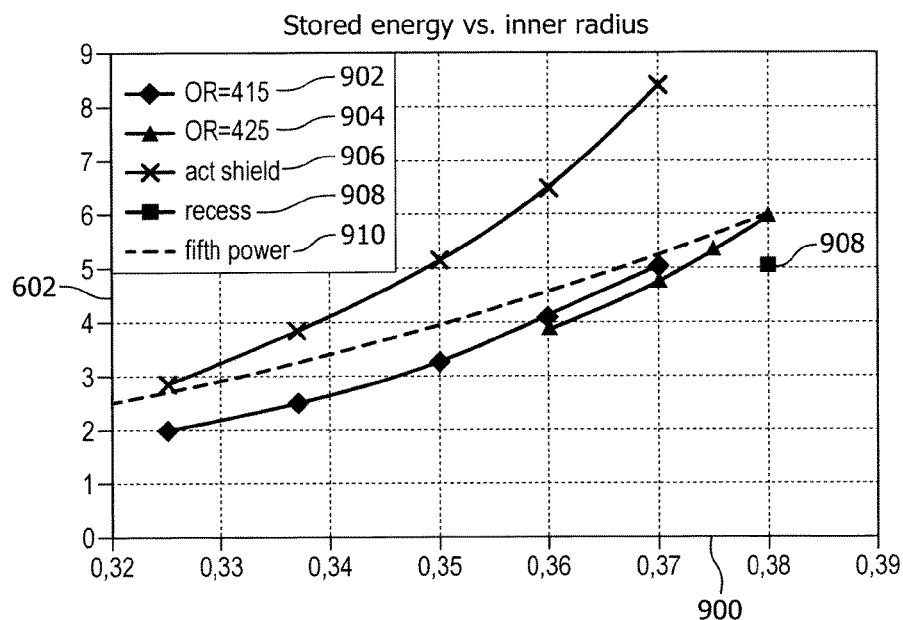
FIG. 9 Stored energy of partly and fully shielded gradient coils vs. inner radius, for outer radius 415 and 425 mm.
Figure 10:
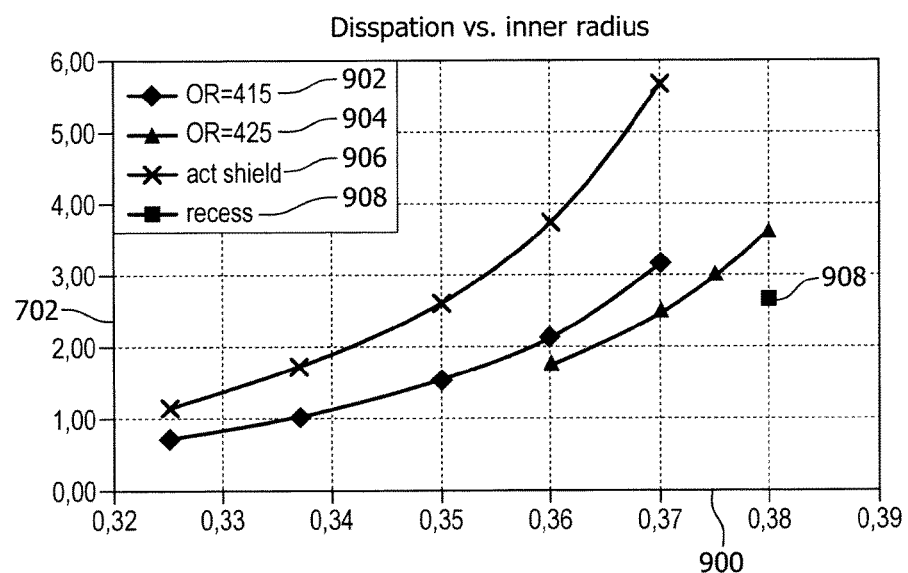
FIG. 10 shows the dissipation of energy versus the inner radius.

The graph shows, that even for the largest coil in the series the efficiency of the coil would be similar to conventional designs. The predicted dissipation is higher, but would be still at an acceptable level. FIG. 9 and FIG. 10 also contain a few points for coils with an outer radius of 425 mm. Bringing the outer coil close to the magnet only slightly improves the stored energy but has a significant effect on the dissipation.

FIGS. 9 and 10 show the results of some simulations for a series of gradient coils which were simulated with increasing inner radius and a constant outer radius of 415 mm. FIG. 9 shows the stored energy 602 versus the inner radius 900. The inner radius is given in meters and the stored energy 602 is in arbitrary units. FIG. 10 shows the dissipation versus the inner radius. The inner radius is labeled 900 again and is given in meters and the dissipation 702 is given in arbitrary units. These plots are shown for constant outer radius of 415 mm 902 and is also shown in several cases for an outer radius of 425 mm also. The curves labeled 906 shows the result for the complete active shielding. The dot labeled 908 shows the inner coil with a recess. FIG. 9 shows the stored energy of partly and fully shielded gradient coils vs. inner radius, for outer radius 415 (425) mm and magnet radius 443 mm. Dot: inner coil with recess, 360/380 mm, OR 425 mm, recess length 600 mm.

FIG. 10 shows the Dissipation in partly and fully shielded gradients coil vs. inner radius, same geometries as FIG. 9.

In all simulations the predicted dissipation in the main magnet sections remained below 0.5 W for 1 mm cold copper. The predicted dissipation in the magnet did not change much when the outer radius of the gradient system was increased.

3.4. Field and Conductor Patterns

Figure 11:
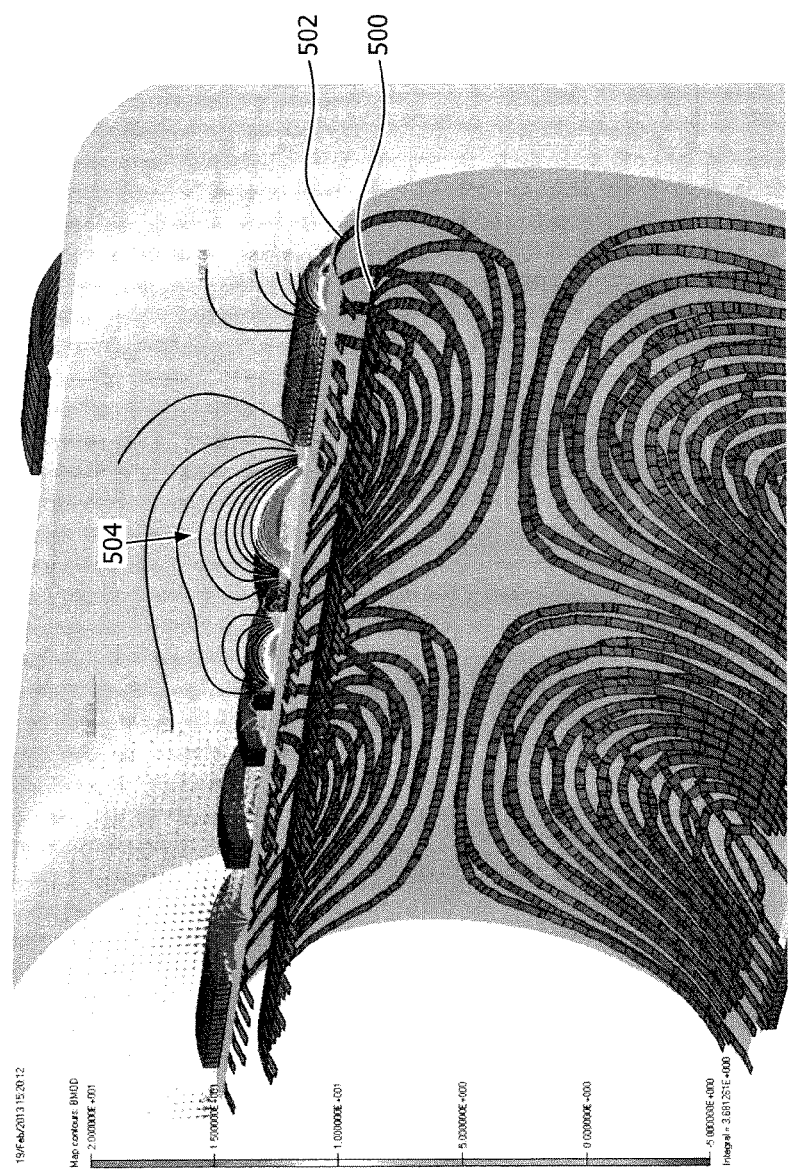
FIG. 11 shows the visualization of a coil geometry as was shown in FIG. 5.

A typical example of the external field of the partially shielded gradient coil is shown in FIG. 2. The field is nicely constrained in the regions of the main magnet coils and expands outward in the space between the coils. FIG. 11, below, is another visualization of the same coil geometry and field data, after discretization into 250 ampere conductors. In oblique planes through the z-axis of the system the field is also small at the magnet coils and much larger in between. Here the field also has an azimuthal component; the flux is partly carried around through the z=0 plane, partly through the x=0 plane. An important consequence of this azimuthally oriented return field is that the radiation screen shall not form closed loops when going once around the system via the loop bore—end_flange1—outer_rollup—end_flange2. This requirement also holds for internal wiring inside the cold mass.

FIG. 11 shows the visualization of a coil geometry as was shown in FIG. 5. In FIG. 11, the Gradient inner radius is 370 mm, the outer radius is 425 mm, magnet inner radius 443 mm.

Figure 12:
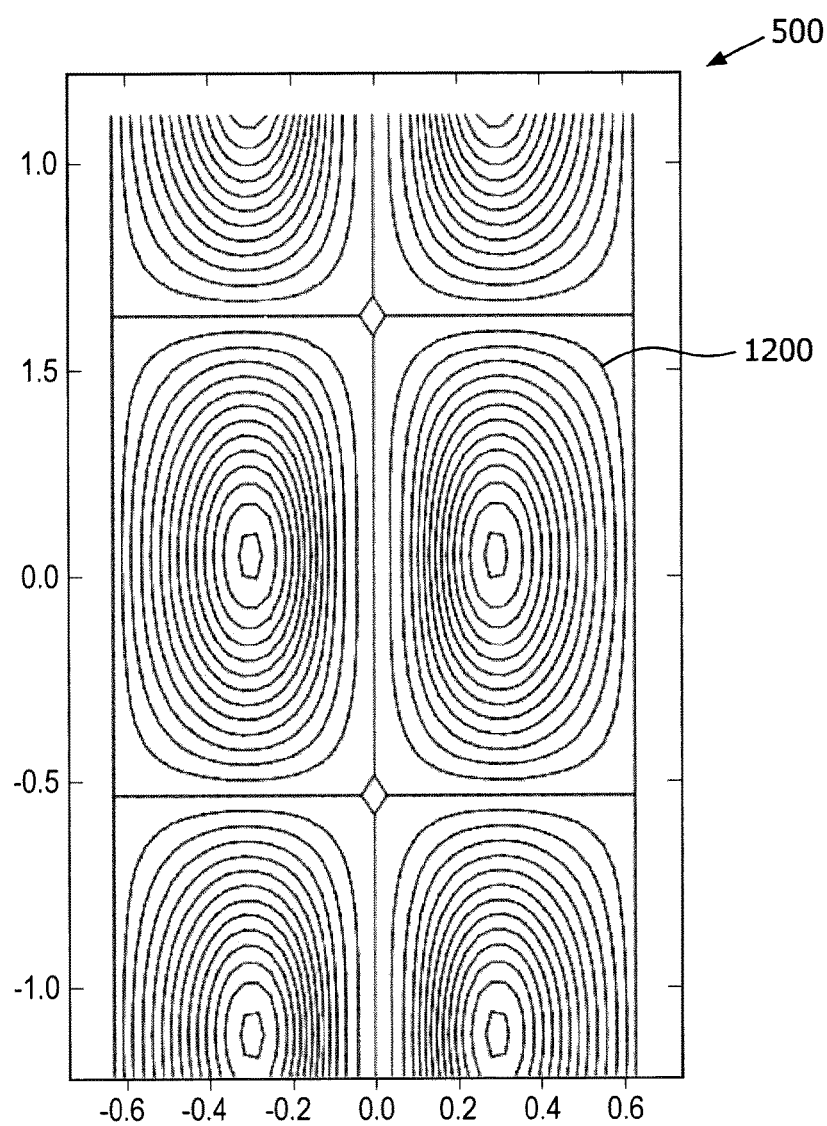
FIG. 12 shows the conductor pattern of the inner conductive layer.
Figure 13:
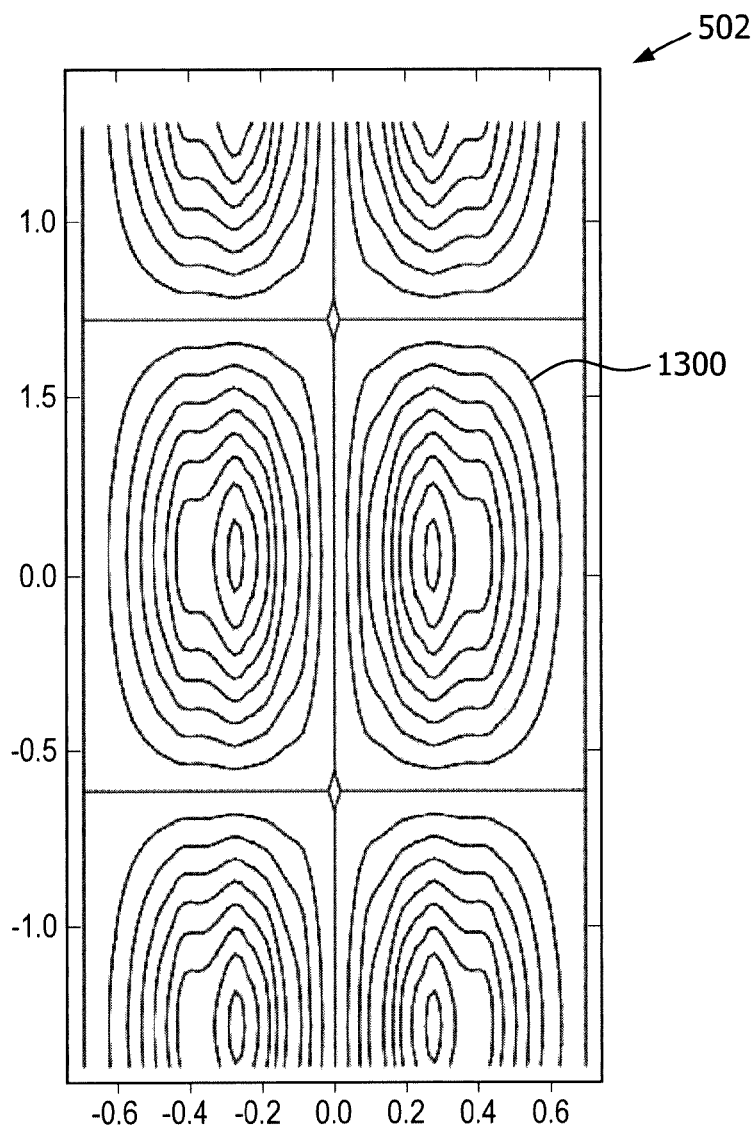
FIG. 13 shows the conductor pattern of the outer conductive layer.

The flat conductor patterns corresponding to this coil are shown in FIGS. 12 and 13. Even with a very small number of turns the external field accurately follows the contour found in the continuous current distribution. With this selection of operating current, the inductance of this coil would be 155 microHenry.

FIG. 12 shows the conductor pattern 1200 of the conductive layer 500. The conductive layer 500 is cylindrical so FIG. 12 shows the conductor pattern 1200 laid out flat. Similarly FIG. 13 shows the conductor pattern 1300 of the outer conductive layer 502.

3.5. Recessed Primary Coil Option

Further increase of the inner diameter of the coil would drive the dissipation probably higher than desired. One way to further increase the patient bore would be to provide a recess in the primary coil and to locate the RF coil in this recess. FIG. 9 and FIG. 10 also contain one data point for a gradient coil with an inner recess, which would allow a further increase in patient bore space. The recess had a depth of 20 mm and a total length of 600 mm (allowing a long and good quality RF coil). In general, the active field shaping concept can be combined with all other methods to improve the gradient efficiency (including non-cylindrical and/or a-symmetric cross-section of the inner bore).

3.6. Z-Gradient Coil

The z-gradient coil is generally much more efficient than the transverse coils, so it is less urgent to attempt to optimize its efficiency. A few sample simulations were done to see whether incomplete shielding is also effective for this channel. Relaxing the external field for these coils has to be done with care, because the z-gradient can become inductively coupled to sections of the main magnet. If the gradient coil causes a net flux in any of the sections of the main coil, this can lead to large induced voltages if the gradient coil is switched. Therefore, in addition to minimizing the field at the main magnet windings, a z-gradient system with relaxed external field shielding also has to satisfy the requirements that the mutual inductance with each magnet section be close to zero. The partly shielded z-gradient coil was generated on the same mesh as that of the transverse coil with inner radius 370 mm, outer radius 425 mm and magnet radius 435 mm. The resulting coil is shown in FIG. 10. The contour lines show the modulus of the field, with contour step size 0.1 mT (@10 mT/m). This coil would have a stored energy of 2.8 J (90 microHenry at 10 mT/m@250 A). The predicted dissipation in the magnet is less than 100 mW. This is good enough to have confidence that a decent z-gradient can be incorporated into the concept, without introducing any additional technological difficulties.

4. Considerations for Practical Implementation

The main differences will occur in the superconducting magnet and in the interface between the magnet and the gradient coil. To facilitate making the concept work, the magnet sections are preferably short in z-direction, providing maximum free space in between. The supporting structure of the magnet preferably does not support eddy currents. Because there will always be some residual external gradient field, the magnet windings need a copper or aluminum liner (which will probably be there anyway in order to keep the magnet sections at operating temperature. The conducting liners should preferably fully enclose the coils.

The radiation screen and the magnet bore tube have to be made such that they do not support eddy currents. For the room temperature bore, this can be done using available technology: all magnets we had prior to 1989 had glass-fiber reinforced plastic bore tubes. One option for this wall would be to make use of the outer cylinder of the gradient coil as the inner wall of the outer vacuum container. The parametric analysis of the previous chapter shows, that the penalty for a separate gradient coil inside a thicker walled bore tube is not dramatic. A beneficial side effect of a non-conducting magnet bore is, that no eddy currents can be induced in it. This is likely to reduce the acoustic noise generated by the system.

A slit radiation screen with good thermal conductivity in axial direction but high thermal and electrical resistance in azimuthal direction could be made from two slit patterns of 2-3 mm thick plate, glued together, in such a way that the conducting elements are oriented predominantly in axial direction. The conducting strips are then either connected alternatingly to one end flange or connected to both when they have an interruption somewhere along the length.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

LIST OF REFERENCE NUMERALS 100 magnetic resonance imaging system
102 magnet
104 bore of magnet
106 cryostat
108 superconducting coil
110 magnetic gradient coil
112 magnetic gradient coil power supply
114 imaging zone
116 radio frequency coil
118 radio frequency transceiver
120 subject
122 subject support
130 cylindrical axis of symmetry
132 length parallel to axis 130
134 outer surface of magnetic gradient coil
150 computer system
152 hardware interface
154 processor
156 user interface
158 computer storage
160 computer memory
162 pulse sequence
164 magnetic resonance data
166 magnetic resonance image
168 control module
170 image reconstruction module
200 magnetic resonance imaging system
202 vacuum
204 radiation shield
206 warm bore
208 inner cylinder of radiation shield
400 mesh defining gradient coil
402 mesh defining super-conducting coil
500 inner conductive layer
502 outer conductive layer
504 expansion of magnetic field
600 outer radius of coils [m]
602 stored energy [A.U.]
604 fully shielded gradient coil
606 shield shaped to avoid superconducting coils
702 dissipation of energy [A.U.]
800 magnetic field contours
900 inner radius [m]
1200 conductor pattern
1300 conductor pattern

The invention claimed is:

1. A magnet assembly for a magnetic resonance imaging system comprising:
    a superconducting magnet with multiple superconducting coils, and wherein there is a superconducting coil selected from the multiple superconducting coils centered coaxially about each reduced field region; and
    an actively shielded gradient coil operable for generating a magnetic field, wherein the magnetic field has a cylindrical axis of symmetry, wherein the gradient coil has a length parallel with the cylindrical axis of symmetry, wherein the magnetic gradient coil has an outer surface, wherein the magnetic field comprises an external magnetic field outside of the outer surface, and wherein the external magnetic field has at least four reduced field regions along the length where the modulus of the magnetic field is less than the average of the modulus of the magnetic field along the length.

2. The magnet assembly of claim 1, wherein the linear extent of each of the reduced field regions as measured along the length is at least 10% of the distance between two adjacent reduced field regions.

3. The magnet assembly of claim 1, further including at least one selected from the group consisting of:
the modulus of the external magnetic field within any one of the reduced field regions is at least a factor of 2.5 times smaller than the average of the modulus of the magnetic field along the length;
the modulus of the external magnetic field within any one of the reduced field regions is at least a factor of 5 times smaller than the average of the modulus of the magnetic field along the length;
the modulus of the external magnetic field within any one of the reduced field regions is at least a factor of 10 times smaller than the average of the modulus of the magnetic field along the length; and
the modulus of the external magnetic field within any one of the reduced field regions is at least a factor of 20 times smaller than the average of the modulus of the magnetic field along the length.

4. The magnet assembly of claim 1, wherein the gradient coil has an inner conductive layer and an outer conductive layer, wherein the inner conductive layer comprises a first set of discrete current loops connected in series, and wherein the outer conductive layer comprises a second set of discrete current loops connected in series, and wherein the first set is connected in series to the second set.

5. The magnet assembly of claim 1, wherein the gradient coil comprises three orthogonal gradient coils, wherein the reduced field region of the orthogonal gradient coils coincide to positions of at least some of the coils of the superconducting magnet.

6. The magnet assembly of claim 1, wherein the magnet comprises a warm bore tube and a radiation screen, and wherein the radiation screen comprises an inner cylinder of the radiation screen between the warm bore tube and the multiple superconducting coils.

7. The magnetic assembly of claim 6, wherein the warm bore tube and the inner cylinder of the radiation screen are electrically non-conducting or have a higher electrical impedance in the azimuthal direction than in the axial direction of the cylinder and/or wherein the inner cylinder is formed from a dielectric.

8. The magnetic assembly of claim 7, wherein the inner cylinder of the radiation screen is formed from a conductive material with slots operable to block eddy currents generated by the external magnetic field of the magnetic gradient coil or the inner cylinder of the radiation screen is formed from a dielectric.

9. The magnet assembly of claim 6, wherein the warm bore tube comprises the magnetic gradient coil.

10. The magnet assembly of claim 1, wherein the magnet is a cryogen free magnet.

11. The magnet assembly of claim 1, wherein the magnetic gradient coil is operable for producing the external magnetic field such that it expands between each superconducting coil.

12. A magnetic resonance imaging system comprising a magnet assembly according to claim 1.

13. A magnetic gradient coil for a magnetic resonance imaging system, wherein the magnetic gradient coil is actively shielded, wherein the magnetic gradient coil is operable for generating a magnetic field, wherein the magnetic field has a cylindrical axis of symmetry, wherein the gradient coil has a length parallel with the cylindrical axis of symmetry, wherein the magnetic gradient coil has an outer surface, wherein the magnetic field comprises an external magnetic field outside of the outer surface, and wherein the external magnetic field has at least four reduced field regions along the length where the modulus of the magnetic field is less than the average of the modulus of the magnetic field along the length, wherein the linear extent of each of the reduced field regions as measured along the length is at least 10% of the distance between two adjacent reduced field regions.

14. A method of designing a magnetic gradient coil for a magnetic resonance imaging system using magnetic design software, the method comprising:
A. defining cylindrical surfaces corresponding to an inner conductive layer and an outer conductor layer of the gradient coil and defining conducting flange regions connecting the inner conductive layer and the outer conductive layer;
B. defining constraints enforcing a magnetic gradient field with a predetermined linearity with an imaging volume inside the gradient coil, wherein the magnetic gradient coil has an outer surface;
C. defining constraints limiting an outer magnetic field surrounding the outer surface such that that there are at least four reduced field regions corresponding to the location of a superconducting coil of a superconducting magnet and/or defining surfaces acting as passive conducting rings at the locations of the reduce field regions and defining constraints for the current induced in these rings or the dissipation caused by these induced currents,
wherein steps A, B, and C define an optimization problem for finding current distributions of the inner conductive layer and the outer conductive layer;
D. solving the optimization problem to calculate a continuous stream function, wherein the continuous stream function is descriptive of the solution to the optimization problem; and
E. converting the continuous stream function obtained as the result of the optimization into a pattern of discrete current loops, wherein the stream and connecting these discrete current loops in series to define a gradient coil design.

15. The method of claim 14, further comprising manufacturing the gradient coil according to the gradient coil design.

16. A method of magnetic resonance imaging comprising:
generating a magnetic field longitudinally through an imaging zone with a superconducting magnet which includes at least four superconducting coil rings separated by annular regions;
with an actively shielded gradient coil disposed between the superconducting magnet and the imaging zone, generating gradient magnetic fields across the magnetic field in the imaging zone and a leakage magnetic field outside the actively shielded gradient coil, wherein the leakage magnetic field has at least four reduced field regions, each reduced field region being longitudinally adjacent one of the superconducting coil rings, wherein a modulus of the leakage magnetic field within any one of the reduced field regions is at least a factor of 2.5 smaller than an average of a modulus of the leakage magnetic field along a length of the superconducting magnet;
receive magnetic resonance signals from a subject in the imaging zone with at least one radiofrequency coil;
with one or more processors, reconstruct the magnetic resonance signals into an image;
display the image on a display device.

* * * * *